(12) United States Patent
Partanen

(10) Patent No.: US 12,139,395 B2
(45) Date of Patent: Nov. 12, 2024

(54) LOW-IMPACT MOTION LIMITER

(71) Applicant: MURATA MANUFACTURING CO., LTD., Nagaokakyo (JP)

(72) Inventor: Mikko Partanen, Vantaa (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 429 days.

(21) Appl. No.: 17/542,851

(22) Filed: Dec. 6, 2021

(65) Prior Publication Data

US 2022/0194782 A1    Jun. 23, 2022

(30) Foreign Application Priority Data

Dec. 22, 2020 (FI) .................................... 20206354

(51) Int. Cl.
*H01L 29/84*  (2006.01)
*B81B 3/00*  (2006.01)

(52) U.S. Cl.
CPC .................. *B81B 3/0051* (2013.01)

(58) Field of Classification Search
CPC .......... B81B 3/0051; B81B 2201/0235; B81B 3/001; B81B 3/0013; B81B 7/0016; B81B 2201/033; B81B 2203/0307; B81B 2203/056; B81B 3/0062; B81B 3/0072; G01P 15/125; G01P 2015/0874; G01P 15/0802; G01P 2015/0814; G01P 15/0888; G01P 15/18; G01P 2015/0871
See application file for complete search history.

(56) References Cited

U.S. PATENT DOCUMENTS

| 2005/0126287 A1 | 6/2005 | Malametz |
| 2016/0370397 A1 | 12/2016 | Lin et al. |
| 2017/0082519 A1 * | 3/2017 | Blomqvist .............. B81B 3/001 |

FOREIGN PATENT DOCUMENTS

| DE | 10118340 A1 * | 10/2002 | .......... B81B 3/0051 |
| DE | 102011006397 A1 | 10/2012 | |
| EP | 1 408 336 A2 | 4/2004 | |
| WO | 02084303 A1 | 10/2002 | |

OTHER PUBLICATIONS

European Search Report dated May 6, 2022 corresponding to European Patent Application No. 21210345.
Office Action dated Nov. 15, 2022, corresponding to Japanese Patent Application No. 2021-198392.
Finnish Search Report dated Sep. 22, 2021 corresponding to Finnish Patent Application No. 20206354.

* cited by examiner

*Primary Examiner* — Niki H Nguyen
(74) *Attorney, Agent, or Firm* — SQUIRE PATTON BOGGS (US) LLP

(57) ABSTRACT

A micromechanical device further comprises a motion limiter configured to prevent a rotor from coming into direct physical contact with a stator. The motion limiter comprises a spring which extends across the rotor-stator gap. The motion limiter further comprises a stopper which is attached to the spring. When the rotor moves toward the stator, the motion limiter is configured to bring the stopper into contact with a counter-structure.

4 Claims, 3 Drawing Sheets

LOW-IMPACT MOTION LIMITER

FIELD OF THE DISCLOSURE

This disclosure relates to microelectromechanical (MEMS) devices, and particularly to motion limiters which prevent undesired contact between mobile and stationary device parts.

BACKGROUND OF THE DISCLOSURE

Microelectromechanical devices such as accelerometers and gyroscopes often comprise a mass element which is suspended from a surrounding fixed structure with a suspension structure which allows the mass element to move in relation to the fixed structure. The mobile mass element may be called a rotor and the fixed structure (or some particular part of the fixed structure) may be called a stator. The electrical potential of the stator may be equal to the electric potential of the rotor, or their electric potentials may be different.

Direct physical contact between the rotor and stator is usually not desirable because it disturbs the operation of the device. Although the rotor and the suspension structure can be dimensioned so that direct contact does not occur in regular operation, external shocks may still displace the rotor so much that it comes into direct contact with the stator. Such contact can cause structural damage, stiction, electrical short-circuits and other faults.

Motion limiters can be implemented in MEMS devices to prevent excessive physical contact between the rotor and the stator in the event of an external shock. A motion limiter may for example comprise a bump which extends from the rotor towards the stator. When the gap between the motion limiter bump and the opposing region of the stator is made narrower than the other gaps between the rotor and stator in the expected direction of motion, the motion limiter will be the first part of the rotor which comes into contact with the stator in the event of an external shock. Damage can be avoided or minimized for example by placing motion limiter bumps in regions which are distant from the most sensitive areas of the rotor and stator. Motion limiter bumps and corresponding structures may also be called stoppers.

However, even when motion limiter bumps are located in the less sensitive regions of the interface between the rotor and the stator, there is a risk that the impact between the bump and the rotor or stator releases particles from the rotor/stator or from the bump itself. Once released, these particles can move toward the more sensitive regions of the device and cause short-circuiting or other damage. Document DE102011006397 discloses a motion limiter which comprises a flexible spring to soften the impact. A problem with this motion limiter is that it consumes a lot of surface area.

BRIEF DESCRIPTION OF THE DISCLOSURE

An object of the present disclosure is to provide an apparatus for solving the above problem.

The object of the disclosure is achieved by an arrangement which is characterized by what is stated in the independent claim. The preferred embodiments of the disclosure are disclosed in the dependent claims.

The disclosure is based on the idea of building a motion limiter which includes a flexible spring which extends between a stator and a rotor. When the rotor and stator move sufficiently close to each other, the spring is compressed and a stopper which is attached to the spring makes contact with a counter-structure at a velocity which is below the velocity of the rotor in relation to the stator. The spring and the motion limiter are arranged in separate regions to preserve surface area. An advantage of this arrangement is that impact forces are reduced with a compact motion limiter.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1A:
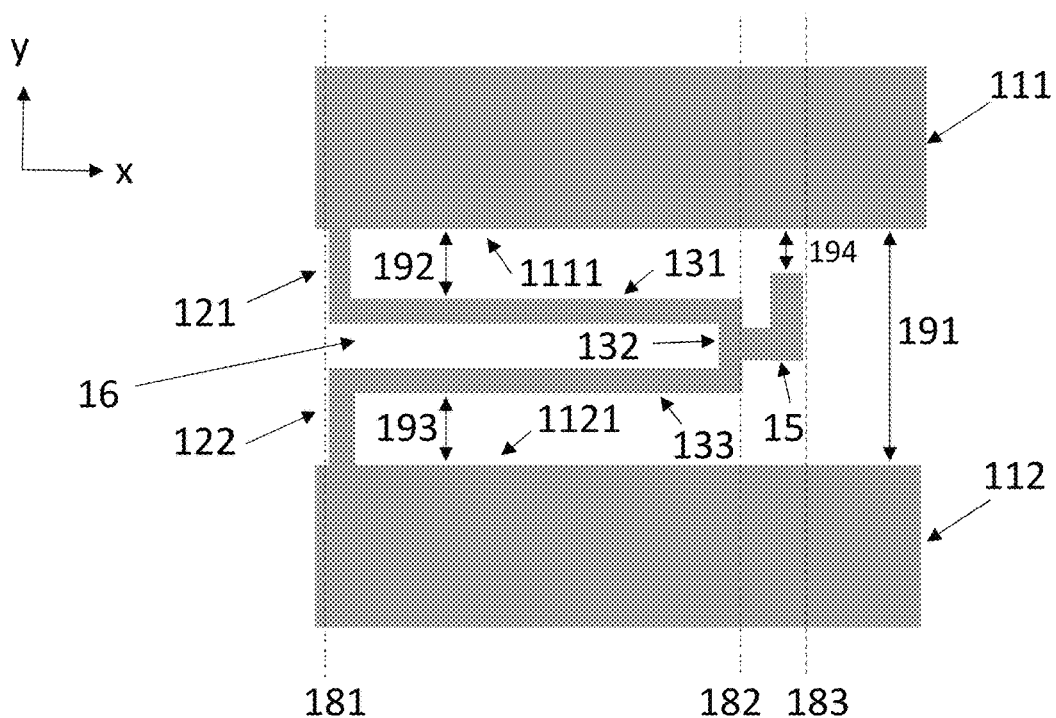
FIGS. 1a-1b illustrate motion limiters with a spring and a stopper.

This disclosure describes a micromechanical device which comprises a mobile rotor which lies in a device plane. The device comprises a fixed stator which is adjacent to the rotor at least in a motion limiter region.

In the motion limiter region, an edge of the stator extends substantially in a lateral direction and an edge of the rotor extends substantially in a lateral direction. The edge of the rotor is separated from the edge of the stator in the motion limiter region by a rotor-stator gap in a transversal direction which is orthogonal to the lateral direction.

The micromechanical device further comprises a motion limiter configured to prevent the rotor from coming into direct physical contact with the stator. The motion limiter comprises at least a first spring which extends across the rotor-stator gap from the rotor to the stator. The first spring is flexible in the transversal direction.

The motion limiter region comprises a contact region and at least a first spring region. The contact region is separated from the first spring region in the lateral direction. The first spring extends across the rotor-stator gap in the first spring region. The motion limiter further comprises at least a first stopper in the contact region. The first stopper is attached to the first spring at the border between the first spring region and the contact region.

The micromechanical device further comprises at least one adjacent counter-structure in the contact region. The counter-structure is separated from the first stopper in the contact region by a stopper gap.

The stopper gap is the distance between the first stopper and its counter-structure when the rotor is in its rest position. The motion limiter is configured to bring the first stopper into contact with the counter-structure across the stopper gap when the rotor moves from its rest position toward the stator by a distance D. The distance D depends on the transversal flexibility of the spring, but it is always greater than the stopper gap. The motion limiter may bring the stopper into contact with the counter-structure before the spring comes into contact with the rotor or the stator.

The device plane is illustrated in this disclosure as the xy-plane. The device plane may for example be defined by a device wafer. The rotor may be formed in the device wafer by etching. Directions which are parallel to the device plane may be referred to as horizontal directions, while the direction which is perpendicular to the device plane may be referred to as the vertical direction. Linear and/or rotational motion where the proof mass remains level in the device plane as it moves away from its rest position may be referred to as "in-plane" motion or "motion in the device plane", while linear and/or rotational motion where the proof mass moves away from its rest position in a vertical direction may be referred to as "out-of-plane" motion, or "motion out of the device plane".

In this disclosure, the words "horizontal" and "vertical" merely refer to the device plane and a direction perpendicular to the device plane, respectively. The words "horizontal" and "vertical" do not imply anything about how the device should be oriented with respect to earth's gravitational field during manufacture or usage.

In this disclosure, the term "spring" refers to a device element which is flexible in at least one direction. Flexibility can be achieved for example by making the length/width or length/height aspect ratio of at least some part of the spring sufficiently large.

The rotor is configured to undergo movement when the device is in use. This movement may be either linear translation or angular rotation, or it may be combination of translation and rotation. The desired movement may comprise continuous back and forth oscillation with a constant amplitude, or a singular swaying motion which occurs when the device undergoes acceleration and where the sway amplitude quickly diminishes. This desired movement may in some cases be actuated by force transducers connected to the rotor. The undesired movement of the rotor, for which a motion limiter is needed, may be induced by external forces, for example when the MEMS device experiences a sudden acceleration shock.

The term "stator" may refer to any fixed structure which can for all practical purposes be considered fixed in relation to the mobile rotor The device wafer may be a silicon wafer and the motion limiter may be formed in the silicon wafer by etching.

The rotor may be suspended by suspension springs from a fixed structure, such as one or more anchor points. This fixed structure may be a part of the device wafer itself and the suspension springs may be formed from the device wafer in the same etching process where the rotor is formed. Alternatively, the suspension springs may be formed from some other structure which is adjacent to the rotor. The stiffness of the suspension springs and the weight of the rotor influence the amplitude of the rotor movement.

FIG. 1a illustrates a micromechanical device where the stator lies in the device plane and the lateral and transversal directions lie in the device plane. The lateral direction here corresponds to the illustrated x-axis and the transversal to the illustrated y-axis. The motion limiter region lies between the transversal lines 181-183 where a stator 111 is adjacent to a rotor 112. The edge 1111 of the stator is substantially parallel with the edge 1121 of the rotor in this region, and these two edges are separated from each other in this region by a rotor-stator gap 191.

The rotor-stator gap may be narrower than any other transversal gap between the rotor and the stator outside of the motion limiter region. However, it may also be wider than some other transversal gap between the rotor and the stator because the illustrated motion limiter may stop the movement of the rotor towards the stator well before the rotor-stator gap 191 is closed. The motion limiter may therefore prevent the rotor from coming into physical contact with the stator anywhere even if the rotor-stator gap 191 in the motion limiter region would be wider than some other transversal gap between the rotor and the stator. This applies to all embodiments illustrated in this disclosure.

The motion limiter illustrated in FIG. 1a is configured to prevent the rotor from moving so far in the transversal direction that it makes contact with the stator. This applies to all motion limiters described in this disclosure. Other motion limiters may be built between other edges of the stator and the rotor to prevent the rotor from moving so far in the direction perpendicular to these edges that it makes contact with the stator.

The motion limiter comprises a first spring 16 which extends across the rotor-stator gap 191 in a first spring region which lies between transversal lines 181-182. The first spring 16 could be any transversally flexible spring, but the spring illustrated in FIG. 1a will be discussed in more detail to explain the key ideas.

The first spring 16 in FIG. 1a comprises a transversal stator end section 121 and a transversal rotor end section 122. The stator end section 121 extends toward the rotor and is substantially stiff in the transversal direction. The rotor end section 122 correspondingly extends toward the stator and is also substantially stiff in the transversal direction. When the rotor moves toward the stator with a velocity V, the rotor end section and stator end section correspondingly move toward each other with the same velocity V. The purpose of the rotor and stator end sections is in this case to displace the transversally flexible parts of the spring a suitable distance from the rotor/stator edges so that neither the rotor nor the stator will come into immediate contact with the spring when the rotor moves toward the stator. The rotor and stator end sections may have any shape which is suitable for achieving this purpose.

The first spring 16 in FIG. 1a also comprises a transversally flexible part (131+132+133) which extends between the stator end section 121 and the rotor end section 122. The transversally flexible part comprises a first elongated section 131 which is attached to the stator end section 121 and extends in a first direction which is substantially parallel to the edge 1111 of the stator 111, so that the first elongated section 131 is separated from the edge 1111 of the stator 111 by a stator-spring gap 192. The transversally flexible part also comprises a second elongated section 133 which is attached to the rotor end section 122 and extends in the first direction so that it is separated from the edge 1121 of the rotor 112 by a rotor-spring gap 193. The transversally flexible part of the first spring 16 also comprises a connecting section 132 which extends from the first elongated section 131 to the second elongated section 133. The illustrated transversally flexible part of the spring is flexible in the transversal direction due to the high length-to-width aspect ratio of elongated sections 131 and 133, where length is a lateral dimension in the direction of the x-axis and width is a transversal dimension in the direction of the y-axis.

A first stopper 15 is attached to the first spring 16. The motion limiter region comprises a contact region where first contact is made and where the motion limiter generates a counterforce which resists the movement of the rotor towards the stator. The contact region lies between transversal lines 182 and 183. In any embodiment presented in this disclosure, the contact region may be aligned in the transversal direction with the geometric center of the rotor in the xy-plane and/or with the center of mass of the rotor.

Figure 1B:
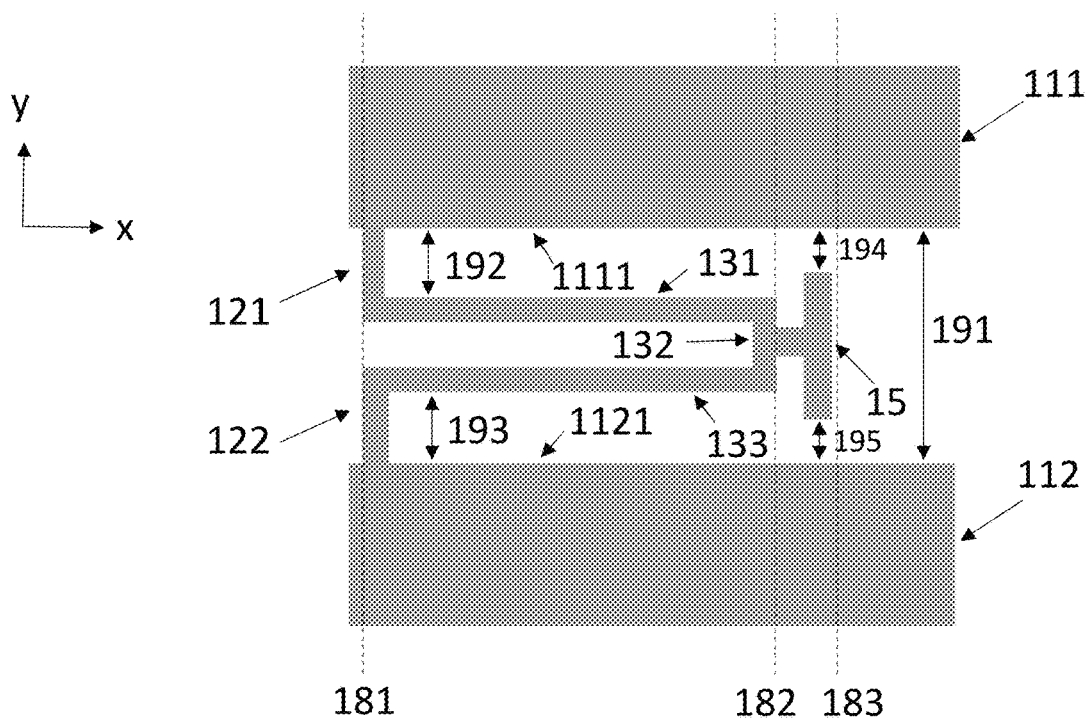

The first stopper 15 is attached to the first spring 16 at the border between the first spring region to the contact region—that is, on the transversal line 182. The first stopper 15 is separated from the edge 1111 of the stator 111 by a stopper gap 194. The stopper gap 194 is narrower than both the rotor-spring gap 193 and the stator-spring gap 192. In other words, in the illustrated case the adjacent counter-structure, which comes into contact with the stopper 15 when the spring is compressed sufficiently, is the edge of the stator. If the stopper would extend towards the rotor instead of towards the stator, the adjacent counter-structure would be the edge 1121 of the rotor 112. This option has not been illustrated, but FIG. 1*b* illustrates a stopper which extends towards both the rotor and the stator so that a first stopper gap 194 is formed between the stopper and the edge of the stator and a second stopper gap 195 is formed between the stopper and the edge of the rotor. The edge 1111 of the stator and the edge 1121 of the rotor are in this case both counter-structures to the first stopper 15.

Returning to the example illustrated in FIG. 1*a*, when the rotor moves toward the stator in the transversal direction by a distance D, the transversally flexible part of the spring 16 is compressed in the transversal direction. The first stopper 15 will therefore move toward the stator by a distance which is less than D. If the rotor 112 moves close enough to the stator 111 to bring the first stopper 15 into contact with the edge 1111 of the stator 11, then the transversal velocity of the first stopper 15 when it strikes the stator 11 will also be less than the velocity of the rotor 112 at that moment. The strike will therefore have lower impact than a comparable strike with a stopper which is rigidly fixed either to the rotor or to the stator. The same effect is obtained if the stopper extends toward both the stator and the rotor as in FIG. 1*b*.

FIGS. 2 and 3 illustrate optional embodiments where the motion limiter region further comprises a second spring region. The first spring region and second spring region are on laterally opposite sides of the contact region. The motion limiter also comprises a second spring which extends across the rotor-stator gap from the rotor to the stator in the second spring region but not in the contact region. The second spring is flexible in the transversal direction. The first stopper is attached to the second spring at the border between the second spring region and the contact region, so that the first stopper extends between the first spring and the second spring. In FIG. 2 reference numbers 211-212, 2111, 2121, 25, 261, 281-283 and 294 correspond to reference numbers 111-112, 1111, 1121, 15, 16, 181-183 and 194, respectively, in FIGS. 1*a* and 1*b*.

As in the previous example, the motion limiter comprises a first spring 261 which extends across the rotor-stator gap in the first spring region 281-282. The first spring 261 in FIG. 2 has the same form as the first spring 16 in FIG. 1*a*, but any other transversally flexible spring structure could also be used. The motion limiter also comprises a second spring 262 in a second spring region 283-284. It can be seen in FIG. 2*a* that the first and second spring regions are on opposite sides of the contact region 282-283 in the lateral direction.

Figure 2A:
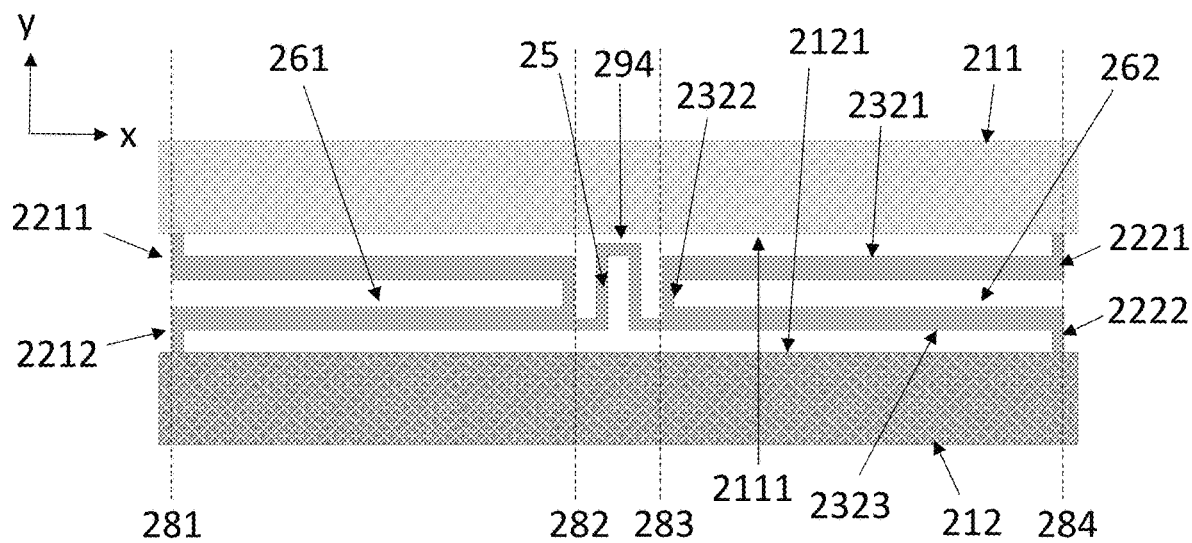
FIGS. 2a-2b illustrate a motion limiter with a first spring, a second spring and a stopper.

FIG. 2*a* shows an example of a second spring 262 which also corresponds to the first spring 16 in FIG. 1*a*. Reference numbers 2221, 2222, 2321, 2322 and 2323 therefore indicate end sections, elongated sections and connecting sections which correspond to parts 121, 122, 131, 132 and 133, respectively, in FIG. 1*a* and have the properties which were described above with reference to these parts. In other words, the first spring may be a folded beam which makes one back- and forth turn in the first direction, and the second spring may be a folded beam which makes one back and forth turn in the direction which is opposite to the first direction. One turn comprises two elongated sections (such as 2321 and 2323) and one connecting section (such as 2322). The width of the turn in the first spring (i.e. the width of the first spring region in the direction of the x-axis in FIG. 2*a*) may be substantially equal to the width of the turn in the second spring (the width of the second spring region). The widths of the first and/or the second spring region in the direction of the x-axis may for example be more than 2 times, more than 3 times or more than 5 times the width of the contact region in the direction of the x-axis.

However, any transversally flexible spring structure could be used as the second spring. The motion limiter could for example comprise a first box spring in the first spring region and a second box spring in the second spring region.

As in the previous example, the transversally flexible part of the second spring is separated from the edge 2111 of the stator 211 by a stator-spring gap and from the edge 2121 of the rotor 212 by a rotor-spring gap.

A stopper 25 is in FIG. 2*a* attached between the first and second spring 261 and 262. The stopper thereby lies in the contact region 282-283. The stopper may for example be a solid bump or a meandering structure such as the stopper 25 between the first and second springs in FIG. 2*a*. The stopper 25 may, but does not have to be, transversally stiff. The meandering structure of stopper 25, for example, may give it some flexibility in both the transversal direction and the lateral direction. This flexibility may in some applications reduce the mechanical tension which the first and second springs may be exposed to when the rotor moves toward or away from the stator.

Figure 3A:
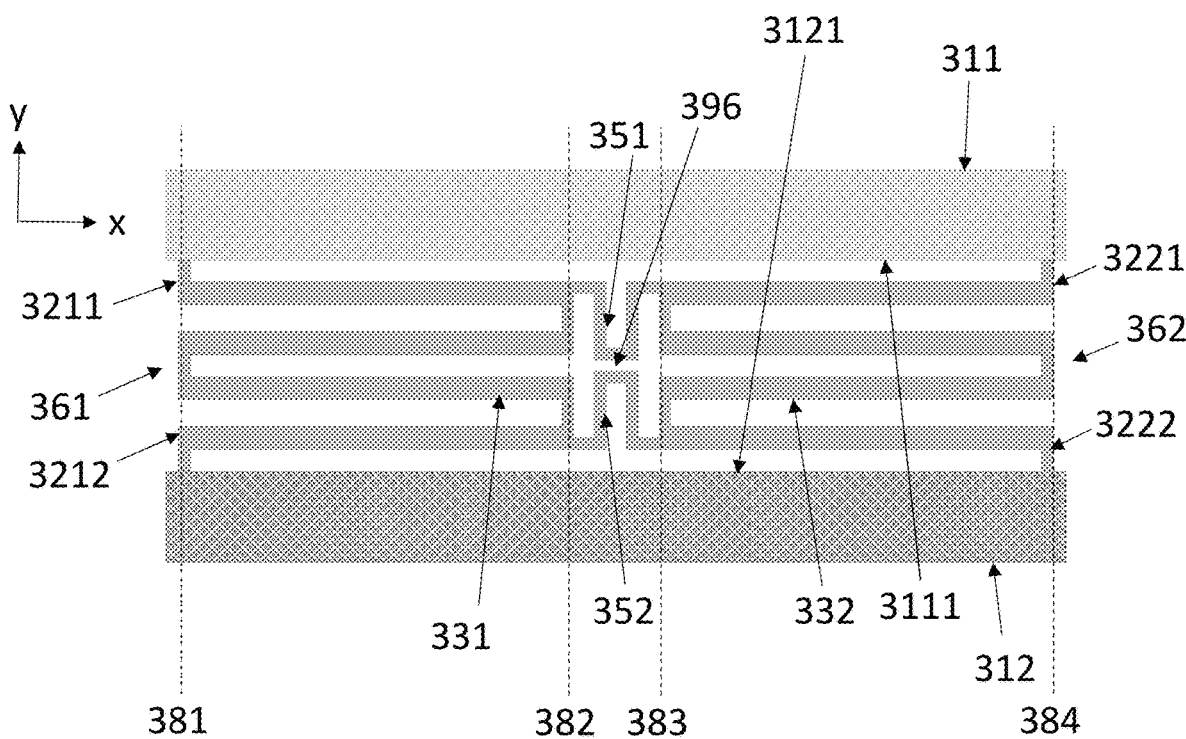
FIGS. 3a-3b illustrate a motion limiter with a first spring, a second spring, a first stopper and a second stopper.

If the stopper has a meandering structure, as in FIGS. 2*a* and 3*a*, the stopper may comprise a folded beam comprising subsections which extend in the transversal direction. These subsections are connected to each other by subsections which extend in the lateral direction. The width of each subsection in the folded beam (measured perpendicular to the direction in which the subsection extends) may be less than, or substantially equal to, the corresponding width of the first and second springs.

The stopper 25 is separated from the edge 2111 of the stator 211 by a stopper gap 294. The stopper gap 294 may be narrower than both the rotor-spring gap and the stator-spring gap. In the illustrated case the counter-structure, which comes into contact with the stopper 25 when the spring is compressed sufficiently, is the edge 2111 of the stator. As in the previous example, if the stopper 25 would extend towards the rotor instead of towards the stator, the counter-structure would be the edge 2121 of the rotor 212. The stopper 25 could alternatively extend toward both the rotor and the stator so that a first stopper gap is formed between the stopper 25 and the edge of the stator and a second stopper gap is formed between the stopper 25 and the edge of the rotor.

In FIG. 2*a* the stopper 25 is located substantially halfway between the two end section pairs (2211+2212, 2221+2222) in the lateral direction. The lateral width of the first spring region 281-282 is substantially equal to the lateral width of the second spring region 283-284. The motion limiter could alternatively be implemented with first and second springs with different lateral widths.

Figure 2B:
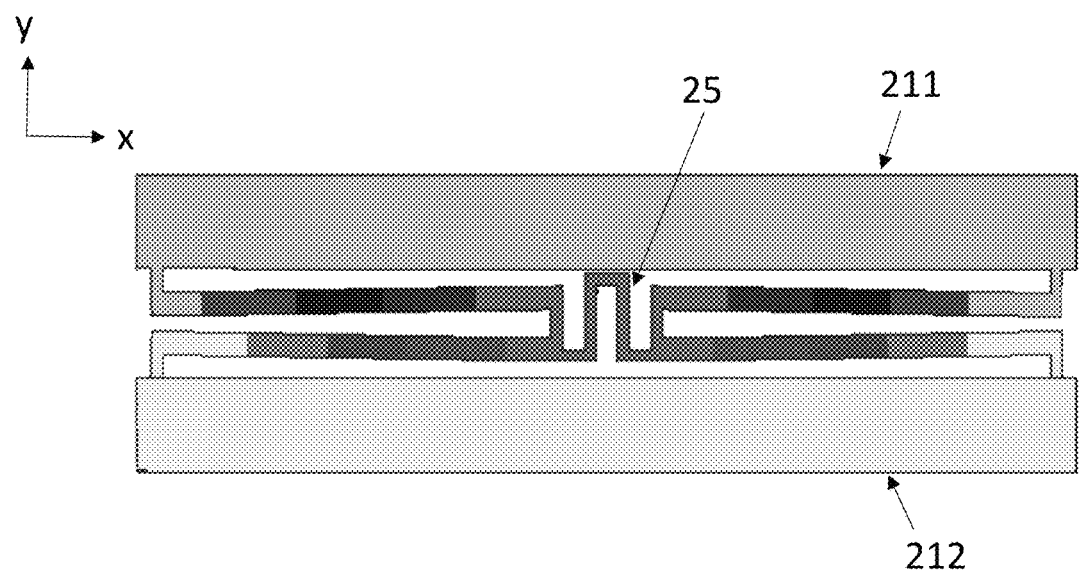

FIG. 2*b* illustrates the action of the motion limiter when the rotor 212 moves toward the stator 211. The first and second spring are compressed in the transversal direction. As a result, the velocity of the stopper 25 in relation to the stator 211 will be less than the velocity of the rotor 212 in relation to the stator. The impact between the stopper 25 and the stator 211 will therefore be less than if the stopper would be rigidly attached to the rotor. The same reduction in impact force is obtained if the stopper faces the rotor instead of the stator, and also if both the stator and rotor are both counter-structures for a stopper which extends in both directions. The motion limiter is configured so that the stopper makes contact with its counter-structure (which is the stator in the illustrated case) before the springs 261 and 262 make contact with the rotor or the stator.

FIG. 3a illustrates an alternative arrangement where reference numbers 311, 3111, 312, 3121, 3211, 3212, 3221, 3222, 361, 362, 381, 382, 383 and 384 correspond to reference numbers 211, 2111, 212, 2121, 2211, 2212, 2221, 2222, 261, 262, 281, 282, 283 and 284, respectively, in FIG. 2a.

In addition to the first stopper 351, here the motion limiter further comprises a second stopper 352 which also extends between the first spring 361 and the second spring 362 in the contact region 382-383, and the second stopper 352 is the counter-structure.

The first and second springs 361 and 362 illustrated in FIG. 3a comprise stator end sections 3211 and 3221, respectively, and rotor end sections 3212 and 3222, respectively. These springs also comprise transversally flexible parts 331 and 332 which extend between the corresponding stator and rotor end sections. The transversally flexible parts 331 and 332 in this case meandering structures. As before, any other transversally flexible spring could alternatively be used.

As in previous embodiments, the first and second springs 361 and 362 are separated from the stator edge 3111 by a lateral stator-spring gap and from the rotor edge 3121 by a lateral rotor-spring gap.

First and second stoppers 351 and 352 are in FIG. 3 attached between the first and second springs 361-362, so that they both lie in the contact region 382-383 between the first spring region 381-382 and the second spring region 383-384. These stoppers 351-352 may be transversally stiff, for example laterally meandering structures as in FIG. 3a, or solid bumps. Alternatively, the stoppers 351-352 could have transversal flexibility. When the rotor is in its rest position, the first and second stoppers 351-352 may be separated from each other by a transversal stopper gap 396.

Figure 3B:
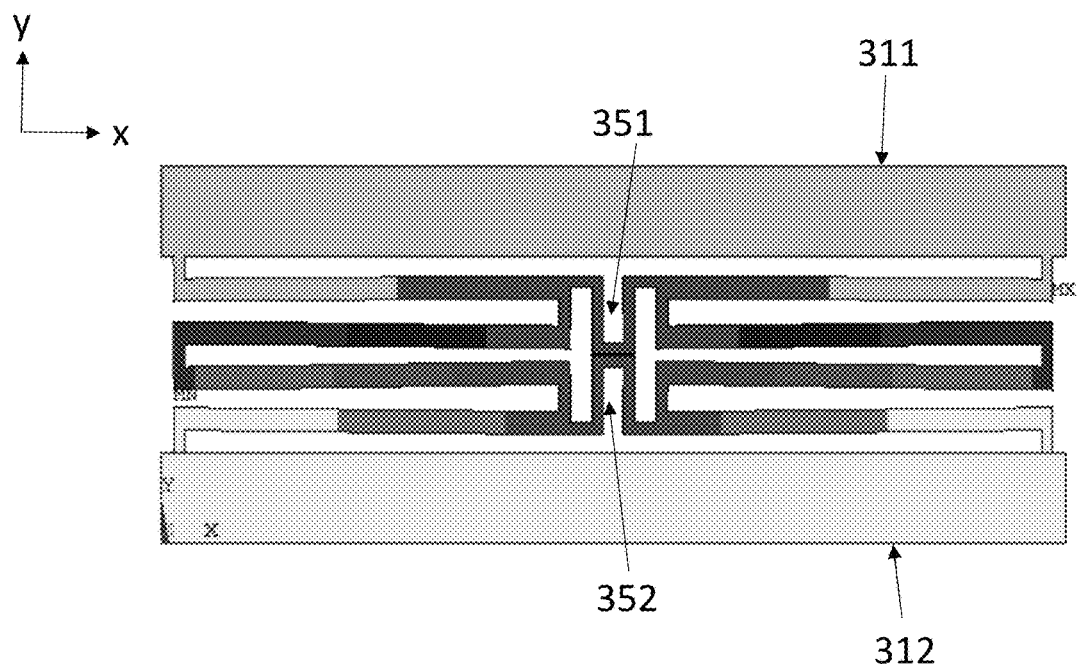

FIG. 3b illustrates the action of the motion limiter when the rotor moves toward the stator in the transversal direction. The first and second springs 361-362 are compressed in the transversal direction. Before the springs comes into contact with the stator 311 or the rotor 312, the first stopper 351 comes into contact with the second stopper 352. As in the embodiments presented below, the impact which takes place on contact will be low due to the flexibility of the springs 361 and 362 in the motion limiter.

Alternatively, the stoppers illustrated in FIG. 3a could be turned in the other direction so that a first stopper gap is formed between the first stopper 351 and the stator 311 and a second stopper gap is formed between the second stopper 352 and the rotor 312. The same stoppers could also, in addition to extending towards the stator and rotor, respectively, extend toward each other. In this case the motion limiter would comprise three stopper gaps, a first stopper gap between the first stopper 351 and the stator 311, a second stopper gap between the second stopper 352 and the rotor 312, and a third stopper gap between the first stopper 351 and the second stopper 352.

In the embodiments illustrated in FIGS. 1a and 2a, the transversally flexible parts of the first and second springs have a meandering shape with one turn. In the embodiment illustrated in FIG. 3a, the transversally flexible parts of the first and second springs have a meandering shape with three turns. Any number of turns could be used, but the area required by the motion limiter will typically be less with fewer turns.

The invention claimed is:

1. A micromechanical device comprising a mobile rotor which lies in a device plane, and the micromechanical device comprises a fixed stator which is adjacent to the rotor at least in a motion limiter region,
   and in the motion limiter region an edge of the stator extends substantially in a lateral direction and an edge of the rotor extends substantially in a lateral direction, and the edge of the rotor is separated from the edge of the stator in the motion limiter region by a rotor-stator gap in a transversal direction which is orthogonal to the lateral direction,
   and the micromechanical device further comprises a motion limiter configured to prevent the rotor from coming into direct physical contact with the stator, wherein the motion limiter comprises at least a first spring which extends across the rotor-stator gap from the rotor to the stator, and the first spring is flexible in the transversal direction,
   wherein the motion limiter region comprises a contact region and at least a first spring region, wherein the contact region is separated from the first spring region in the lateral direction, and the first spring extends across the rotor-stator gap in the first spring region, and the motion limiter further comprises at least a first stopper in the contact region, wherein the first stopper is attached to the first spring at the border between the first spring region and the contact region,
   and the micromechanical device further comprises at least one adjacent counter-structure in the contact region, wherein the at least one adjacent counter-structure is separated from the first stopper in the contact region by a stopper gap,
   wherein the motion limiter region further comprises a second spring region, wherein the first spring region and second spring region are on laterally opposite sides of the contact region, and the motion limiter also comprises a second spring which extends across the rotor-stator gap from the rotor to the stator in the second spring region but not in the contact region, and the second spring is flexible in the transversal direction, and the first stopper is attached to the second spring at the border between the second spring region and the contact region, so that the first stopper extends between the first spring and the second spring.

2. The micromechanical device according to claim 1, wherein the at least one adjacent counter-structure is the edge of the stator.

3. The micromechanical device according to claim 1, wherein the at least one adjacent counter-structure is the edge of the rotor.

4. The micromechanical device according to claim 1, wherein the motion limiter further comprises a second stopper which also extends between the first spring and the second spring in the contact region, and the second stopper is the at least one adjacent counter-structure.

* * * * *